United States Patent [19]

Sukegawa et al.

[11] Patent Number: 5,021,852
[45] Date of Patent: Jun. 4, 1991

[54] SEMICONDUCTOR INTEGRATED CIRCUIT DEVICE

[75] Inventors: Shunichi Sukegawa; Takashi Inui, both of Houston, Tex.

[73] Assignee: Texas Instruments Incorporated, Dallas, Tex.

[21] Appl. No.: 353,858

[22] Filed: May 18, 1989

[51] Int. Cl.[5] ............ H01L 29/06; H01L 27/04; H01L 29/72; H01L 27/02

[52] U.S. Cl. ................. 357/23.11; 357/23.6; 357/48; 357/35; 357/41; 357/43

[58] Field of Search .......... 357/23.6, 23.11, 47, 357/34, 35, 41, 48, 43

[56] References Cited

U.S. PATENT DOCUMENTS

| | | | |
|---|---|---|---|
| 4,582,565 | 4/1986 | Kawakatsu | 156/643 |
| 4,679,300 | 7/1987 | Char et al. | 29/571 |
| 4,717,942 | 1/1988 | Nakamura et al. | 357/23.6 |
| 4,729,964 | 3/1988 | Natsuaki et al. | 437/29 |
| 4,819,054 | 4/1989 | Kawaji et al. | 357/49 |
| 4,860,071 | 8/1989 | Sunami et al. | 357/23.6 |

FOREIGN PATENT DOCUMENTS

| | | | |
|---|---|---|---|
| 62-35662 | 2/1987 | Japan | 357/23.6 |
| 62-123764 | 6/1987 | Japan | 357/23.6 |
| 62-179145 | 8/1987 | Japan | 356/23.6 |
| 63-51667 | 3/1988 | Japan | 357/23.6 |

Primary Examiner—Jerome Jackson, Jr.
Assistant Examiner—Donald L. Monin, Jr.
Attorney, Agent, or Firm—William E. Hiller; N. Rhys Merrett; Melvin Sharp

[57] ABSTRACT

This invention relates to a semiconductor integrated circuit device which has an insulated-gate type element part comprising a capacitor which is formed through the use of a trench in a semiconductor layer, wherein a low-resistance buried layer is formed in the semiconductor layer prior to forming the trench so that the trench is formed to be surrounded by the low-resistance buried layer and thereby the low-resistance buried layer is used as an electrode of the capacitor.

6 Claims, 6 Drawing Sheets

SEMICONDUCTOR INTEGRATED CIRCUIT DEVICE

FIELD OF USE IN INDUSTRY

The present invention relates to a semiconductor integrated circuit device, such as a dynamic RAM (Random Access Memory).

PRIOR ART

In the past, semiconductor integrated circuit devices used a combination of bipolar techniques and MOS techniques (BiMOS) and so on, for example, dynamic RAMs have a MOS transistor constituted in a memory cell part, and a bipolar transistor used in its peripheral circuit. In such case, CMOS (Complementary MOS) and so on are used for the peripheral circuit.

For a capacitor of the memory cell in the semiconductor integrated circuit device as described above, various capacitor cells have been developed in order to reduce the cell area and increase the capacity of the capacitor.

However, the structure of the capacitor cell as before causes problems as shown in the following:

(1) The reduction in the area of the element part comprising the capacitor has a limit, and it is difficult to make the capacitor minute. When the capacitor is reduced, the capacity itself becomes smaller.

(2) In addition to this, the gain in the capacitor area has also a limit, at it is difficult to increase the storage capacity.

(3) In the structure in which a capacitor is formed in a trench, in addition to (2) above, a channel is led to the substrate side, causing leakage current.

OBJECTS OF THE INVENTION

An object of the invention is to provide a semiconductor integrated circuit device wherein the area of element part including a capacitor, especially, in the semiconductor integrated circuit device can be reduced, and the capacity of the capacitor can be increased, to eliminate the leakage current.

STRUCTURE OF THE INVENTION

This invention relates to a semiconductor integrated circuit device which has an insulated-gate type element part comprising a capacitor which is formed through the use of a trench in a semiconductor layer, wherein a low-resistance buried layer is formed in said semiconductor layer prior to forming said trench so that said trench is formed to be surrounded by the low-resistance buried layer and thereby said low-resistance buried layer is used as an electrode of said capacitor.

BRIEF DESCRIPTION OF THE DRAWINGS

FIGS. 1-6 show an embodiment of the invention;

FIG. 1 is an enlarged sectional view of an important part of a dynamic RAM of BiMOS structure;

FIG. 2 is an enlarged sectional view of the MC (memory cell part) of FIG. 1, (showing a cross-sectional view taken along the line II—II of FIG. 4 which will be described later);

FIG. 3 is an enlarged sectional view of the other part of the MC of FIG. 1, (showing a cross-sectional view taken along the line III—III of FIG. 4 which will be described later);

FIG. 4 is a plan view of the MC of FIG. 1;

FIG. 5 is a cross-sectional perspective view of the same MC; and

Figure 1:
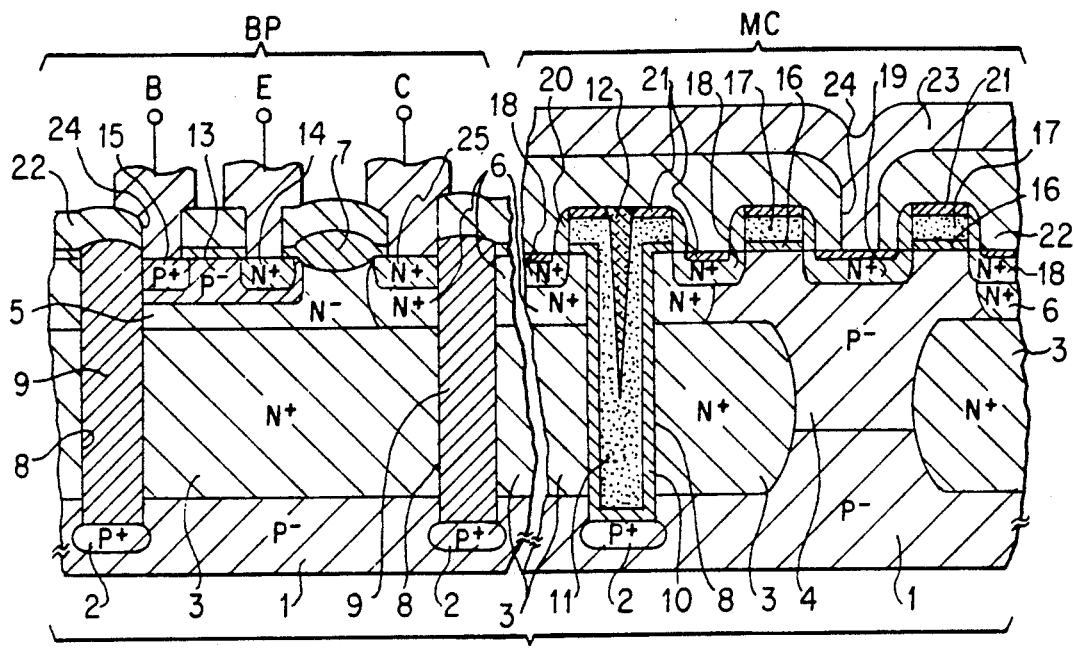

In reference numerals shown in the figures:
1 . . . P— type silicon substrate;
3 . . . N+ type buried layer;
6 . . . N+ type (diffused) region;
8 . . . trench;
10 . . . oxide film;
11 . . . N-type polysilicon layer;
16 . . . gate oxide film;
17 . . . gate electrode (word line);
18 . . . source region;
19 . . . drain region;
23 . . . aluminum distributing line (bit line);
30, 40, 50, 60 and 70 . . . (N type or P type impurity) ion;
BP . . . bipolar transistor part; and
MC . . . memory cell part.

THE EMBODIMENTS

The embodiment of the invention will be now described.

FIGS. 1-6 show the embodiment of the invention; an example in which the invention is applied to a high-integration dynamic RAM using BiMOS techniques.

The dynamic RAM in accordance with this example, as shown in FIG. 1, comprises a memory cell part MC and a bipolar transistor part BP which forms its peripheral circuit. For this peripheral circuit, CMOS, for example, may be used, but its illustration has been omitted here.

Referring to the memory cell part MC (hereinafter referred to simply as the MC), a P— type epitaxial layer 4 is provided on a main face of a P— type silicon substrate 1 with an N+ type buried layer 3 in between. On the surface of the P— type epitaxial layer 4, an N+ type source region 18 and an N+ type drain region 19 are formed in a predetermined pattern, between which a gate electrode 17 is provided with a gate oxide film 16 in between, to constitute an N-channel MOS transistor (transfer gate). A high-density N+ type diffused region 6 is provided in the source region 18 in order to make a connection with a capacitor which will be described later.

As shown in the figure, a trench 8 is formed in a predetermined position between the source regions 18—18, passing through the N+ type diffused region 6 and the N+ type buried layer 3 and further to the P— type substrate 1; and a P+ type channel stopper region 2 is provided under the bottom of the trench. An N+ type polysilicon (field plate) 11 is filled in the trench 8 with an oxide film 10 in between; and the N+ type buried layer 3 is used as an electrode of the capacitor along with the N+ type diffused region 6. It is characteristic that the N+ type buried layer 3 is provided in common with the N+ type buried layer 3 of a bipolar transistor part BP (hereinafter referred to simply as the BP) which will be described later.

A silicide layer 21 is provided on the surfaces of the source region 18, of the drain region 19, and of the respective polysilicon layers (the gate electrode 17 and the N+ type polysilicon layer 11), to improve the conductivity. A nitride layer 20 to be a mask is deposited on the side face of each polysilicon layer, and an insulating layer (filling oxide) 12 is formed in the N+ type polysilicon layer 11.

An insulating layer 22 is further deposited on the surface; a contact hole 24 is provided in the drain region 19; and a distributing line (bit line) 23 which is made of aluminum, for example, is formed.

The MC is constituted as described above. The gate electrode (word line) 17, the source region 18, and the drain region 19 constitute a transfer gate; and the source region 18 is connected with the capacitor which comprises the N type polysilicon layer 11 and the insulating oxide film 10, using the N+ buried layer 3 (and further the N+ diffusion layer 6) as an electrode.

Figure 2:
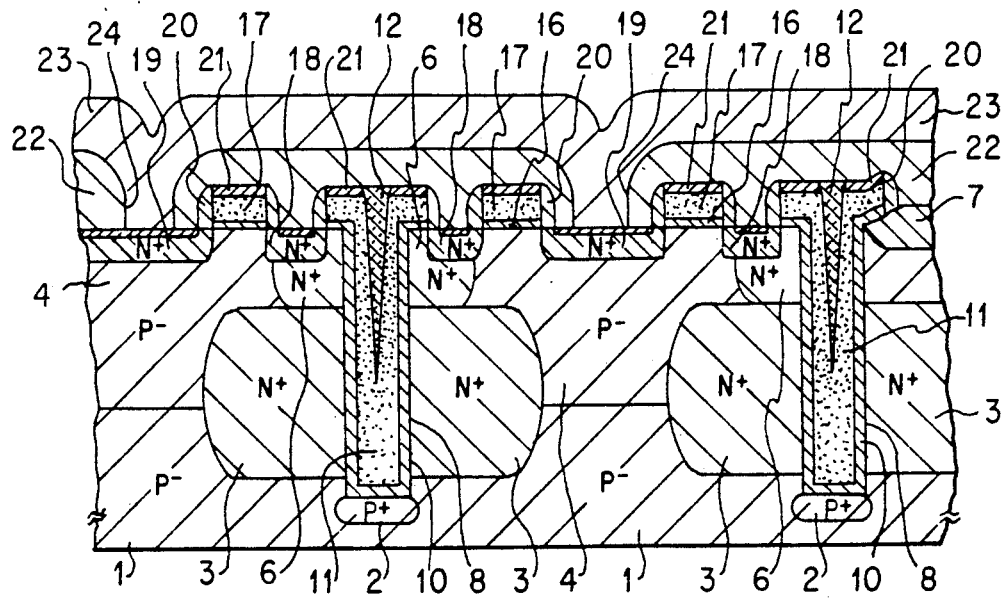
Figure 3:
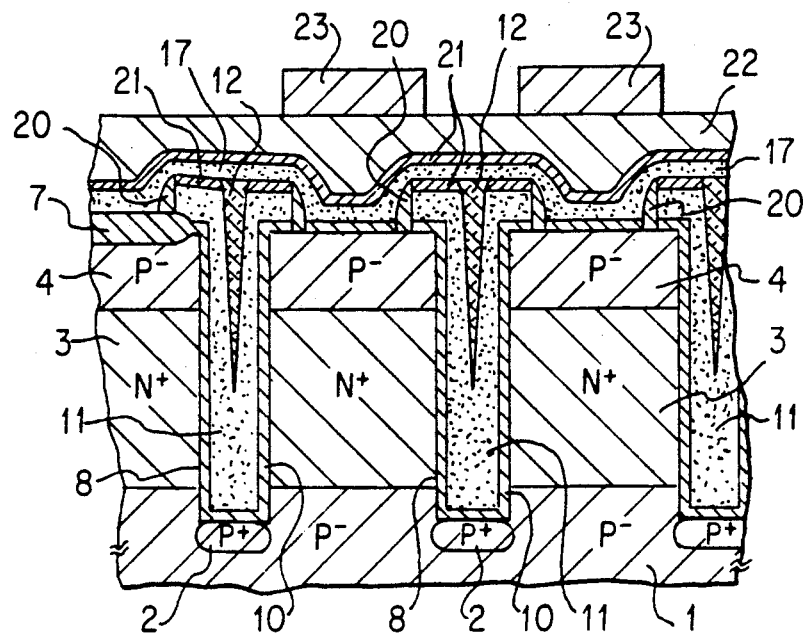
Figure 4:
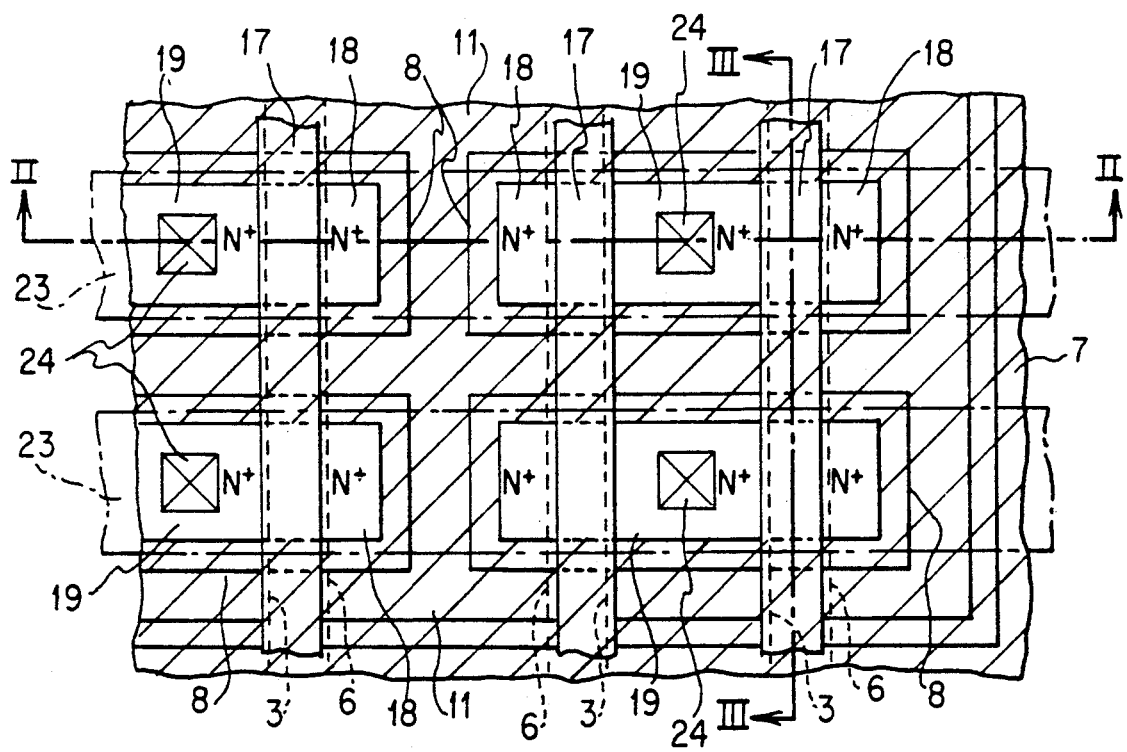
Figure 5:
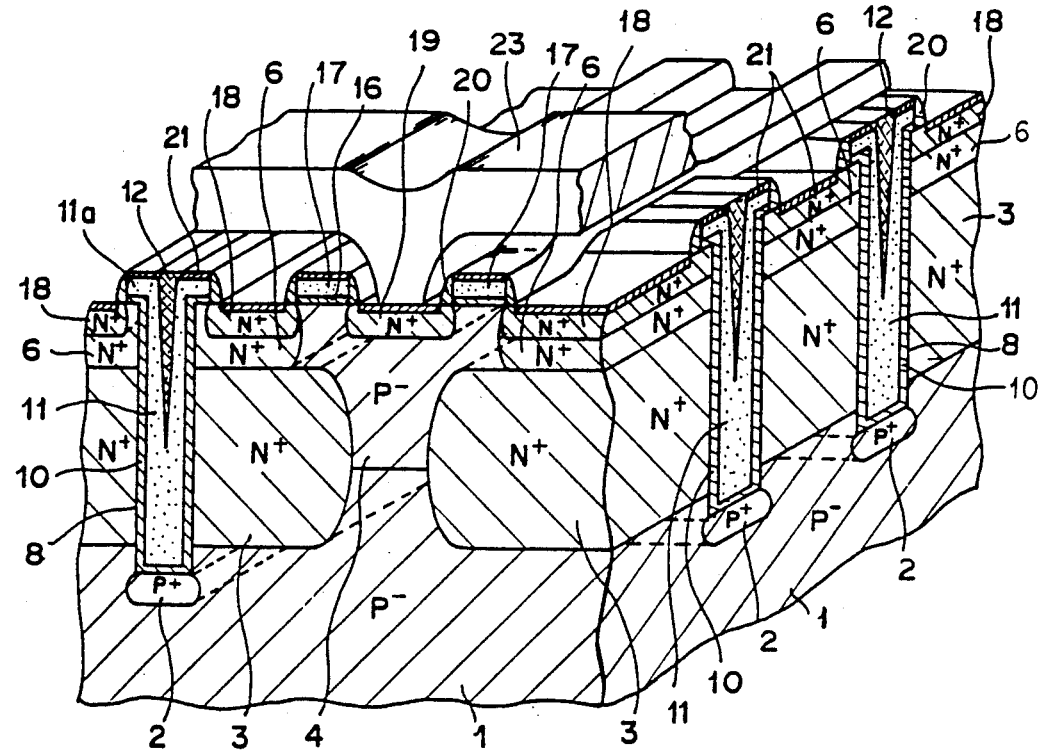

FIGS. 2–4 show the MC of FIG. 1: FIG. 2 is a cross-sectional view taken along the line II—II of FIG. 4; FIG. 3 is a cross-sectional view taken along the line III—III of FIG. 4; FIG. 4 is a plan view; and FIG. 5 is a cross-sectional perspective view of the memory cell (in which the insulated layer 22 and so on are not shown). In FIG. 4, the region of the polysilicon layer 11 is shown by slanted lines.

As shown in FIG. 1, in the BP, a trench 8 similar to that of the above MC is formed; and SiO2 layer 9 which is filled in the trench isolates element regions; and a P− type base region 13 is formed by diffusion in an N− type diffusion layer 5 on the N+ type buried layer 3 which exists in the element region. An N+ type emitter region 14 and a P+ type base electrode region 15 are respectively diffused in the base region 13; an N+ type diffused region 6 is provided on the N+ type buried layer 3; and further an N+ type collector electrode region 25 is formed by diffusion thereupon. Therefore, the NPN-type vertical bipolar transistor has the collector electrode region 25 and the base region 13 connected with each other through the N− type diffused region 5, the buried layer 3, and the N+ type diffused region 6. In the figure, B indicates the base electrode, E indicates the emitter electrode, C indicates the collector electrode, and they are formed of aluminum, for example. 7 represents a field oxide film, and 2 represents the P+ type channel stopper region as in the MC.

As described above, with the memory of the BiMOS structure of this embodiment, the N+ type buried layer 3 and further the N+ type diffused region 6 are provided in common in the MC and BP prior to forming the trench 8 so as to surround the trench 8. In the MC, the capacitor is formed using the N+ type buried layer 3 and further the N+ type diffused region 6 as the electrode and using the trench 8. On the other hand, the trench 8 is used for isolating the elements in the BP. With the above structure, the following notable effects can be obtained:

(1) The N+ type buried layer 3 (and further the N+ type diffused region 6) to be the electrode of the capacitor is formed prior to forming the trench 8 by taking advantage of well-known burying techniques in the BP, so that the buried region 3 with a large area can be formed in the predetermined region of the MC to be used as the capacitor electrode without any special new process technique, (and, in adding the N+ type diffusion region 6 to this, the area of the capacitor can be further earned). Therefore, the capacity of the capacitor of the MC can be increased.

(2) The buried region 3 does not need accurate control as in the impurity diffusion, and the wide region in the BP can be easily formed with the use of well-known burying techniques, so that the capacity of the capacitor can be effectively increased. In this regard, the device can be manufactured with a process of the same proportions as that of the usual CMOS 1M dynamic RAM.

(3) Furthermore, the inside of the trench 8 (i.e., the polysilicon layer 11) can be set to 0 V to store the charge on the side of the N+ type region 3 (and further 6), so that the formation of a undesired channel on the substrate side can be prevented; (the prevention of the leakage current).

(4) Moreover, since the capacitor is constituted through use of the trench 8, although the capacity of the capacitor is large, the area covered by the MC is fairly reduced to being very advantageous to make it minute and highly-integrated.

(5) Since the trench 8 is used for isolating the elements in the BP, the junction area of the buried layer 3 and the P− type substrate 1 can be reduced to decrease the parasitic capacity of the collector.

Next, the method for manufacturing a memory in accordance with this example will be described, referring to FIG. 6.

Figure 6A:
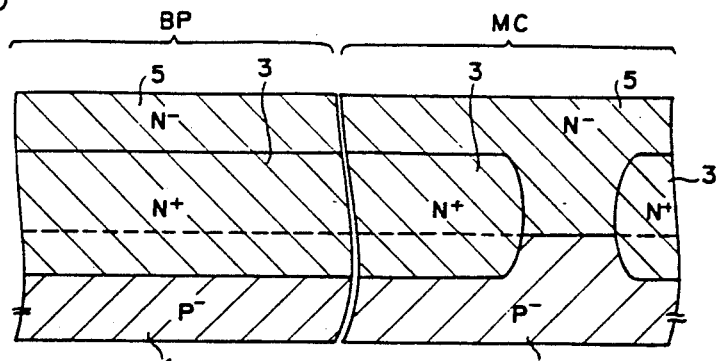
FIGS. 6A-6L are respective cross-sectional views showing the respective steps of the method for manufacturing the device of FIG. 1.
Figure 6B:
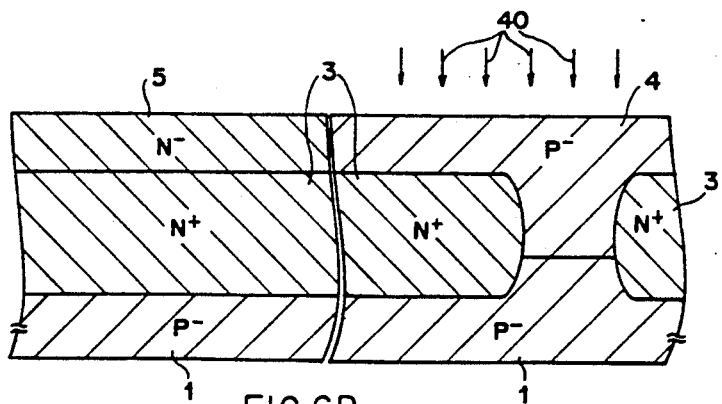

As shown in FIG. 6A, the N+ type buried layer 3 is provided in the range from the BP to the MC in the P− type silicon substrate 1 with well-known techniques, and the N− type epitaxial layer 5 is further formed. Then, as shown in FIG. 6B, a P− type impurity (e.g., boron) ion 40 is implanted into the MC by well-known ion implantation, to change the conductivity type of the N− type epitaxial layer 4 to form the P− type region 4. At the time of the above ion implantation, all the parts other than where the ion 40 is implanted (the MC in this figure) are covered with a mask (e.g., photoresist), not shown here. Also, the mask is not shown in the following figures.

Figure 6C:
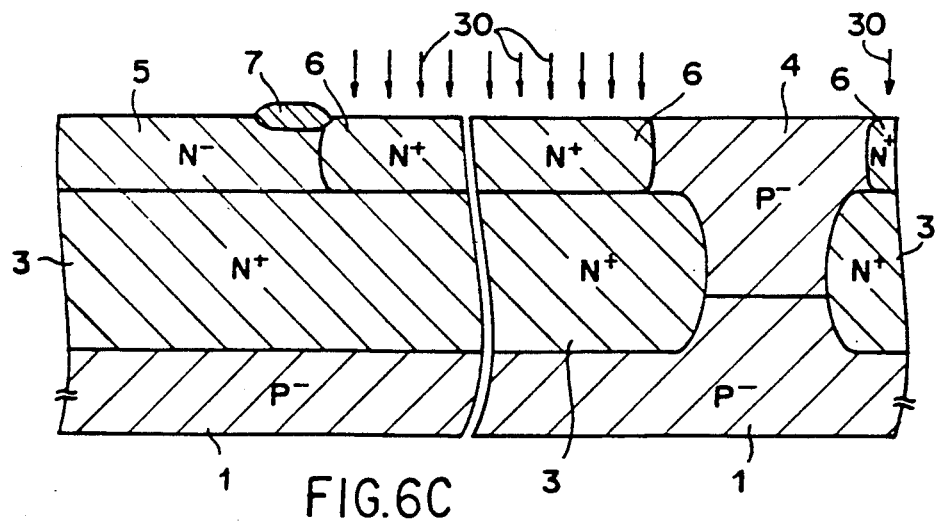

Next, as shown in FIG. 6C, after forming the selective oxide film (field oxide film) 7 with well-known LOCOS (Local Oxidation of Silicon) techniques, an N− type impurity ion 30 is highly and selectively implanted to form the N+ type region 6. It is preferable that the N+ type region 6 be so narrow as to have no effect on the transfer gate channel of the MC. That is, in FIG. 1, with the existence of the N+ type region 6 in the position on the outside of the transfer gate channel, the carrier movement through the region 6 can be prevented to perform the on-off operation of transfer gate with good reliability.

Figure 6D:
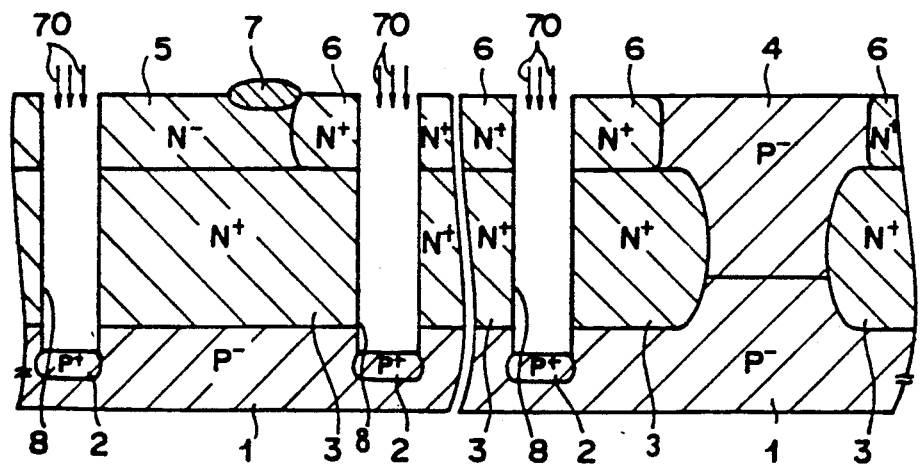

Then, as shown in FIG. 6D, the deep trench 8 reaching the substrate 1 is selectively formed in the semiconductor region with well-known dry etching techniques, and further a P+ type impurity (e.g., boron) ion 70 is implanted in the bottom of the trench with the ion implantation to form the P+ type channel stopper region 2. The trench 8 is used for separating the elements in the BP, and is used as the capacitor in the MC.

Figure 6E:
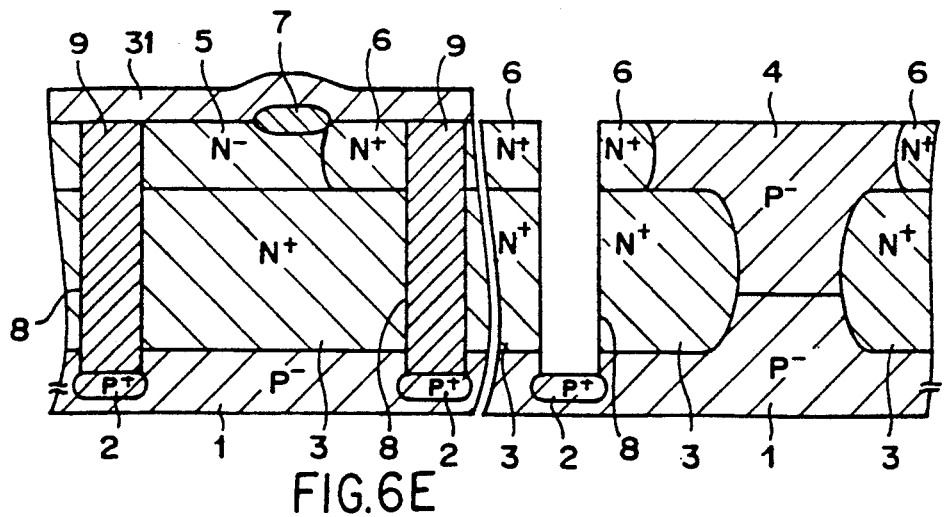

Next, the SiO2 9 is stacked over the entire surface including the trench 8 by CVD (Chemical Vapor Deposition), and then the SiO2 9 is etched (etched back) with the dry etching to leave the SiO2 9 only in the trench 8 of the BP as shown in FIG. 6E. After that, the BP is covered with a mask 31 (e.g., photoresist).

Figure 6H:
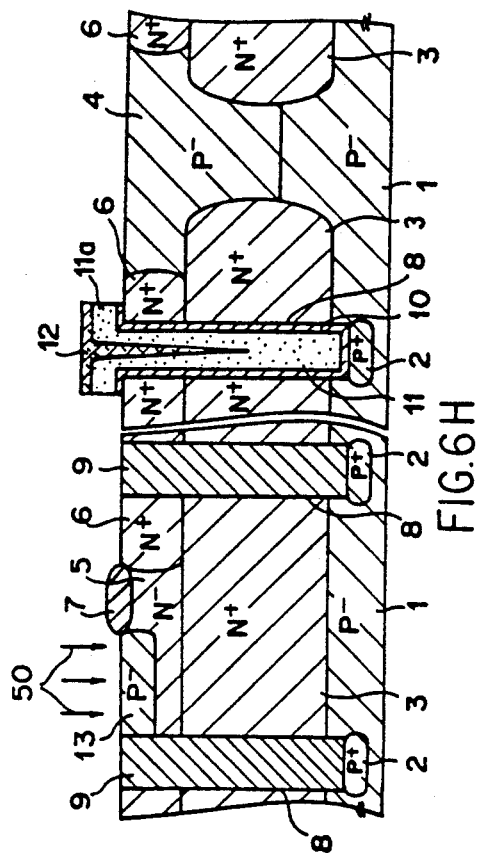
Figure 6I:
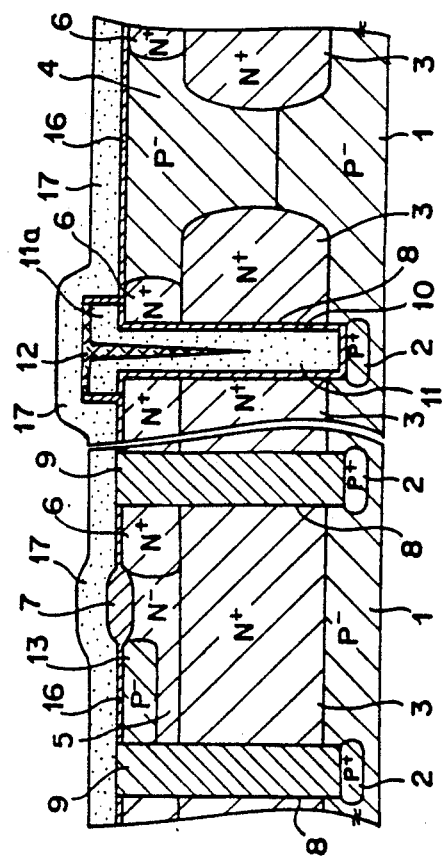
Figure 6F:
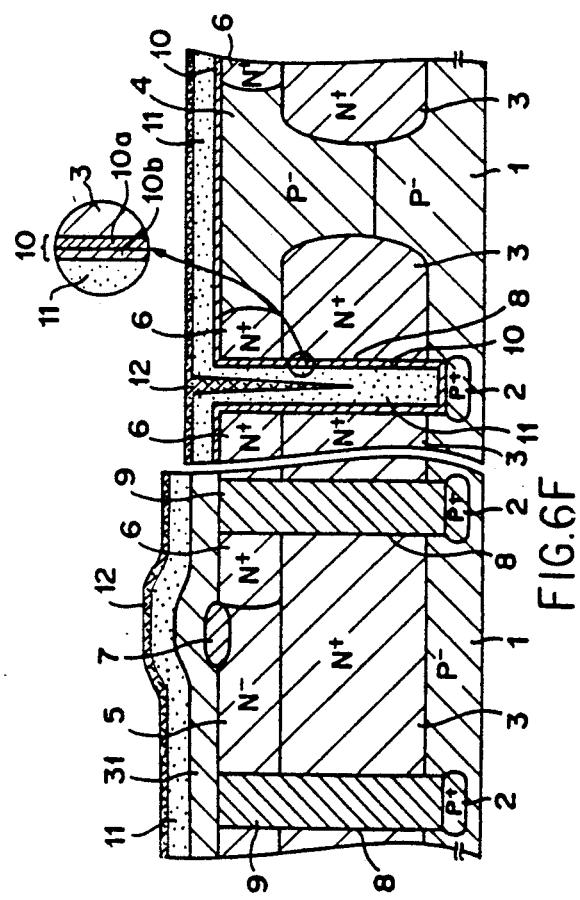

Then, as shown in the enlarged fragmentary sectional view of FIG. 6F, a thin Si2N4 film 10a is deposited on the surface of the MC including the trench 8 by CVD, and is further thermally oxidized to grow a thin SiO2 film 10b and to form the insulating film 10. As shown in FIG. 6F, the N-type polysilicon 11 is stacked over the entire surface by CVD, and further the SiO2 film 12 is formed all over the surface by CVD.

Figure 6G:
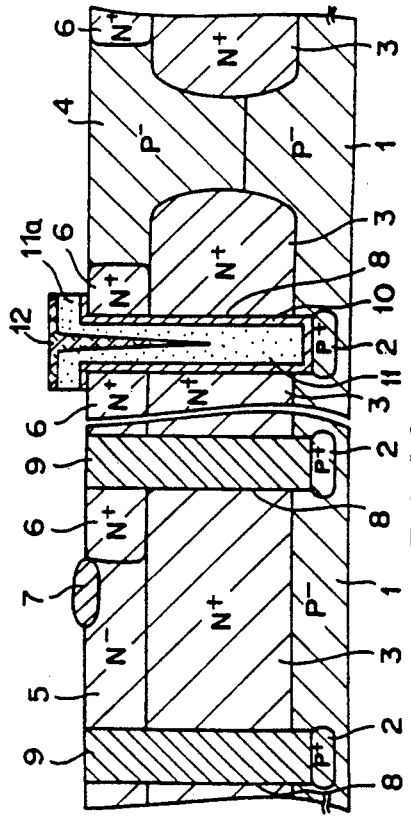

Next, as shown in FIG. 6G, the SiO2 film 10, the N— type polysilicon layer 11, and the SiO2 film 12 are etched to be left only on the trench 8 of the MC. The SiO2 film is to planarize the upper surface by filling in the upper surface concave part of the polysilicon layer 11.

Then, as shown in FIG. 6H, a P-type impurity (e.g., boron) ion 50 is implanted in the predetermined region of the BP with the ion implantation to form the P— type region 13.

Next, as shown in FIG. 6I, the whole surface is thermally oxidized to grow the SiO2 film and to form the gate oxide film 16, and then, the polysilicon 17 is further stacked over the entire surface by CVD. At this time, an N— type impurity (e.g., As) ion implantation is performed to make the polysilicon layer 17 of the MC have a low resistance, but is not shown here.

Figure 6J:
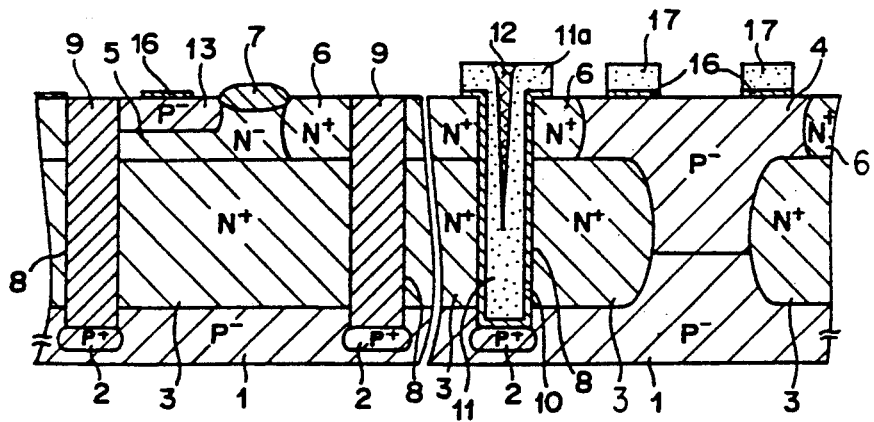

Next, as shown in FIG. 6J, the polysilicon layer 17 and the gate oxide film 16 of the MC are patterned to remain, and further only the polysilicon 17 of the BP is etched away to pattern the SiO2 film 16.

Figure 6K:
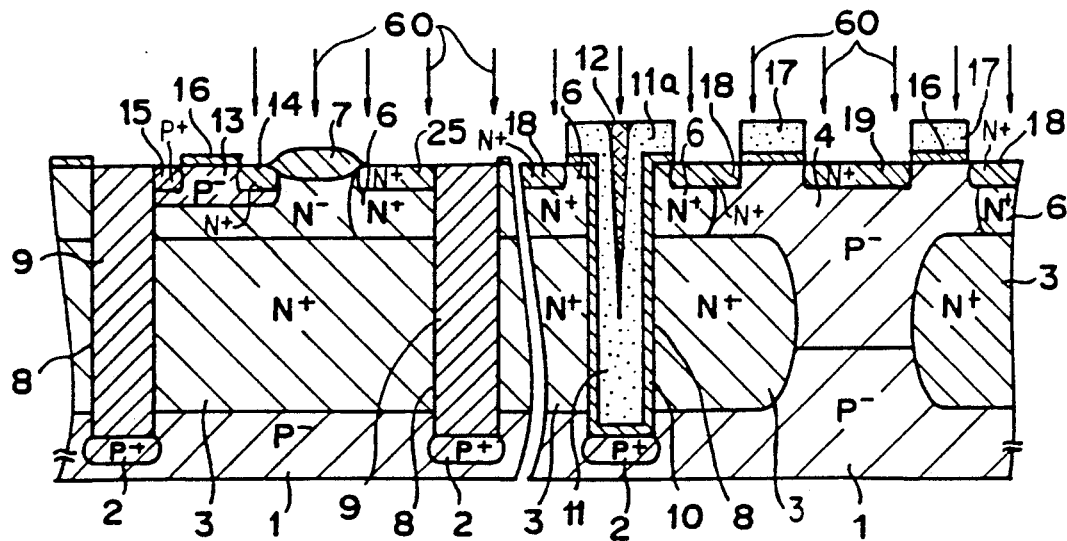

The, as shown in FIG. 6K, an N— type impurity (e.g., As) 60 is selectively ion-implanted to form the N+ type emitter region 14 and the N+ type collector region 25 in the BP, and at the same time, to form the N+ type source region 18 and the N+ type drain region 19 respectively in the MC. While the illustration is omitted, a P—type impurity (e.g., boron) is selectively ion-implanted in the same manner as described above to form the P+ type base electrode region 15 in the BP.

Figure 6L:
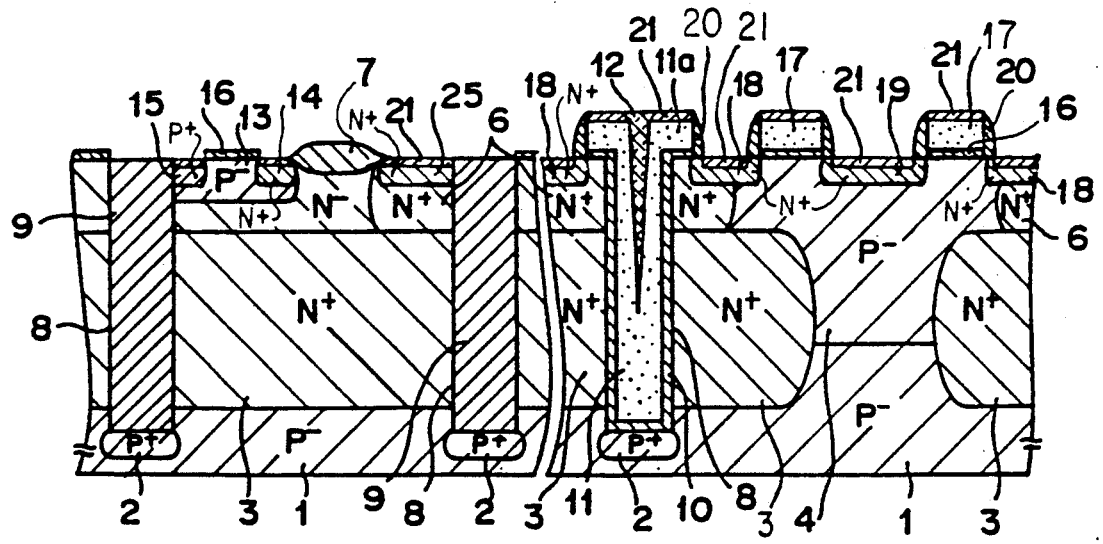

Next, as shown in FIG. 6L, the SiO2 layer 20 is selectively formed on the side surface of each polysilicon layer in the MC with well-known side-wall techniques, and further the surface of each polysilicon layer and of each N+ type diffusion region in the MC is silicided, for example, by depositing and annealing titanium, etching the unnecessary titanium away and forming the silicide layer 21. While the illustration of the rest of the process is omitted, by performing the insulating film coating, each distributing line process and so on by well-known methods, the device shown in FIG. 1 is completed.

As apparent from the manufacturing method described above, in the memory with BiMOS structure in accordance with this example, since a special buried layer which is usually provided in the bipolar transistor part BP is also applied to the memory cell part MC to be used as the electrode of the capacitor, the electrode of the capacitor of the MC can be formed in the initial stage of the manufacturing process, and the capacitor can thereafter be easily formed with the use of the trench without any special additions to the process. Therefore, the bipolar technique is also skillfully applied to the memory cell, so that the electrode region of the capacitor can be increased (i.e., the capacity of the capacitor can be increased). Especially in the semiconductor integrated circuit devices of this kind, it is an epochal method to use the trench for forming the capacitor, and to use the buried layer with the low resistance as the electrode of the capacitor.

The embodiment described above may be further changed on the basis of the technical thought of the invention.

For example, the form, arrangement and so on of the trench can be changed, and as its forming method, various dry etching and so on can be used. The form, arrangement and so on of the buried layer can be further changed. The forming method of each region described above may be variously changed.

In the example described above, while polysilicon is used as the material of the gate electrode of the MC, other materials, for example, high melting point metals such as tungsten, tantalum and so on, and silicide, being a compound of metal and Si, may be used, and in place of each electrode of the BP and aluminum distributing lines of the MC, other appropriate materials may be used.

The conductivity type of the above each semiconductor region may be reversed, and the P-channel MOS may be used for the memory cell. The arrangement of other peripheral circuits and so on can be changed. The invention can be applied to the integrated circuits other than the dynamic RAM described above. In the above example, while the MOS is of horizontal type, it may be changed to the vertical type MOS, and in this case, the integration degree can be further increased.

EFFECTS OF THE INVENTION

Since the invention has the capacitor constituted with the use of the trench provided in the semiconductor layer as described above, the occupied area of the planar cell can be reduced. The low-resistance buried layer is formed in the above semiconductor layer prior to forming the trench described above, and the low-resistance buried layer is formed so as to surround the above trench, so that the large buried layer can be formed in the predetermined region, and further this buried layer can be used as the electrode of the above capacitor to effectively increase the capacity of the capacitor. Since the charge can be stored on the above buried layer side, the leakage current due to the formation of the undesired channel can be prevented.

What is claimed is:

1. A semiconductor integrated circuit device comprising:
    semiconductor substrate means of one conductivity type;
    said semiconductor substrate means of said one conductivity type being provided with a plurality of vertical trenches extending thereinto form the top surface thereof and disposed in spaced relationship with respect to each other;
    a memory cell including a capacitor and a field-effect transistor provided in one portion of said semiconductor substrate means;
    a bipolar transistor provided in another portion of said semiconductor substrate means adjacent to the portion thereof in which said memory cell is disposed;
    a buried semiconductor layer of the other conductivity type embedded in said semiconductor substrate means in spaced relation to the top surface thereof and common to the memory cell and the bipolar transistor as provided in said semiconductor substrate means;
    the memory cell included in said semiconductor substrate means having at least one of said plurality of vertical trenches, said at least one vertical trench penetrating said buried semiconductor layer of the other conductivity type and bottoming into said semiconductor substrate means of said one conductivity type below said buried semiconductor layer of the other conductivity type;
    a liner of insulation material bounding the vertical trench included in the memory cell;

conductive material filling the vertical trench included in the memory cell and spaced from said semiconductor substrate means and said buried semiconductor layer embedded therein by said insulation liner interposed therebetween;

said conductive material, said insulation liner and said buried semiconductor layer defining a trench capacitor of said memory cell in which said conductive material and said buried semiconductor layer are capacitor plates and the insulation liner is a dielectric layer therebetween; and a pair of vertical trenches of said plurality of vertical trenches being disposed on opposite sides of said bipolar transistor provided in said semiconductor substrate means, each of said pair of vertical trenches being filled with insulation material to electrically isolate said bipolar transistor.

2. A semiconductor integrated circuit device as set forth in claim 1, wherein the field-effect transistor of said memory cell includes spaced source and drain regions of the other conductivity type disposed in said semiconductor substrate means and opening onto the top surface thereof;

the portion of said semiconductor substrate means of said one conductivity type disposed between said source and drain regions of the other conductivity type defining a channel region;

a gate electrode of conductive material disposed above said channel region;

a layer of insulation material interposed between said gate electrode and said channel region and defining a gate insulator; and a region of the other conductivity type disposed in said semiconductor substrate means of one conductivity type and extending between said source region and said buried semiconductor layer of the other conductivity type to connect said field-effect transistor to said capacitor of said memory cell.

3. A semiconductor integrated circuit device as set forth in claim 2, wherein said region of the other conductivity type connecting said field-effect transistor and said capacitor of said memory cell is common to said bipolar transistor provided in said semiconductor substrate means.

4. A semiconductor integrated circuit device as set forth in claim 3, wherein said bipolar transistor provided in said semiconductor substrate means is a vertical bipolar transistor having collector, base and emitter regions;

the portion of said semiconductor substrate means of one conductivity type in which said vertical bipolar transistor is disposed having a region of the other conductivity type disposed above the buried semiconductor layer of the other conductivity type and opening onto the top surface of said semiconductor substrate means, said last-mentioned region of the other conductivity type defining the collector region;

a region of said one conductivity type disposed in said collector region of the other conductivity type and defining the base region;

a region of the other conductivity type disposed in said base region of said one conductivity type and defining the emitter region, said emitter region opening onto the top surface of said semiconductor substrate means;

a collector electrode contact region of the other conductivity type and having a higher dopant concentration than the collector region of the other conductivity type disposed in said semiconductor substrate means and opening onto the top surface thereof in spaced relation to said base region and said emitter region disposed therein; and said region of the other conductivity type which connects the field-effect transistor and the capacitor of said memory cell and common to said bipolar transistor connecting said collector electrode contact region of higher dopant concentration of the other conductivity type to said collector region of the other conductivity type.

5. A semiconductor integrated circuit device as set forth in claim 1, further including a channel stopper region of said one conductivity type of higher dopant concentration than said semiconductor substrate of said one conductivity type disposed below each of said plurality of vertical trenches included in said memory cell portion and said bipolar transistor portion of said semiconductor substrate means within said semiconductor substrate means of said one conductivity type and along the bottom of the respective vertical trench.

6. A semiconductor integrated circuit device as set forth in claim 1, wherein said one conductivity type is P-type and the other conductivity type is N-type.

* * * * *